United States Patent [19]

Lane

[11] Patent Number: 5,021,758
[45] Date of Patent: Jun. 4, 1991

[54] CIRCUIT ARRANGEMENT COMPRISING MESFET SWITCHED SPIRAL INDUCTOR

[75] Inventor: Anthony A. Lane, Northampton, England

[73] Assignee: Siemens Plessey Electronic Systems Limited, Chessington, England

[21] Appl. No.: 280,466

[22] Filed: Dec. 6, 1988

[51] Int. Cl.[5] .......................................... H03H 11/00
[52] U.S. Cl. ................... 333/245; 333/262; 334/56; 357/51
[58] Field of Search ............. 333/164, 139, 174, 17.3, 333/262, 245; 307/571, 584, 521; 357/23.14, 51, 56; 334/56

[56] References Cited

U.S. PATENT DOCUMENTS 4,471,330  9/1984  Naster et al. .................. 333/164
4,853,658  8/1989  Lane ............................. 333/164

OTHER PUBLICATIONS

Naster, R. J., et al., "Affordable MMIC Designs for Phased Arrays", *Microwave Journal;* Mar. 1987; pp. 141-147; Copy in 333/164.

Selin, John R.; "Continuous Variable L-Band Monolithic GaAs Phase Shifter", *Microwave Journal;* Sep. 1987; pp. 211-218; copy in 333/164.

*Primary Examiner*—Benny T. Lee
*Attorney, Agent, or Firm*—Fleit, Jacobson, Cohn, Price, Holman & Stern

[57]  ABSTRACT

A circuit arrangement which includes a switched inductor comprises a spiral inductor and a MESFET coupled in parallel for switching the spiral inductor in and out of a circuit. The MESFET has at least two gates, at least one of which and at least one section of at least one turn of the spiral inductor, are all mounted adjacent to one another on an active mesa. The switched inductor thus enables parasitic capacitances to be reduced and saves space on the mesa.

7 Claims, 4 Drawing Sheets

CIRCUIT ARRANGEMENT COMPRISING MESFET SWITCHED SPIRAL INDUCTOR

FIELD OF THE INVENTION

The present invention relates to a circuit arrangement which includes a switched inductor, for switching inductor in and out of a circuit.

Circuits such as voltage control oscillators (VCOs), switched filters and in particular shifters, often need to be able to switch one or more inductors into and out of the circuit.

DESCRIPTION OF PRIOR ART

A broadband, constant phase, microwave phase shifter as shown in FIG. 1, is typical of this type of circuit and utilizes a switched inductor. To achieve phase shifting, the circuit is switched between high and low pass states by the switched inductor through the coupling a spiral inductor 2 and a MESFET 4 in parallel. In the low pass state, the inductor 2 is short circuited to ground by biasing the MESFET 4 to it's "on" state and therefore the spiral inductor 2 is switched out of the circuit. In the high pass state, the MESFET 4 is biased to it's "off" state, thereby enabling the inductor 2 to function normally.

A practical realisation of the spiral inductor 2 and MESFET 4 is shown in FIG. 2. The MESFET 4 is partially mounted on an active Ga As mesa. The MESFET 4 is coupled to the spiral inductor 2 via a transmission line 5.

Furthermore, there is shown in FIG. 3, two circuit model diagrams of the inductor 2 and MESFET 4 shown in FIG. 2. The circuit model in FIG. 3a illustrates the high pass state when the MESFET 4 is biased to it's "off" state and the low pass state is shown in FIG. 3b when the MESFET 4 is biased to it's "on" state. The resistor R is connected between the inductor 2 and ground and the resistor $R_{on}$ is connected between one terminal of the transmission line 5 and ground. In both states the switched inductor suffers from parasitic capacitances due to the source-drain $C_{ds}$, drain-ground $C_d$ and spiral $C_1$ capacitances. When the switched inductor is operating at microwave frequencies, these parasitics can be in the order of ohms. Consequently these parasitic capacitances, which are in parallel to the inductor 2, can reduce the self-resonant frequency of the inductor 2 and consequently cause a deterioration of the higher frequency performance of the switched inductor.

In addition, the switched inductor also suffers from parasitics due to discontinuities at the junctions between the MESFET 4 and inductor 2, line length loss and interconnections.

OBJECTS OF THE INVENTION

Therefore, the present invention aims to provide a circuit arrangement which includes a switched inductor in order to obviate the aforementioned disadvantages.

According to the present invention there is provided a circuit arrangement which includes a switched inductor for switching a spiral inductor in and out of a circuit comprising the spiral inductor electrically coupled in parallel to a MESFET, the spiral inductor having a number of turns, each turn defining a number of sections, and the MESFET having an even number of gates, each gate being mounted on an active mesa, wherein at least one gate and at least one section of at least one turn of the spiral inductor are mounted adjacent to one another on the active mesa. Preferably the spiral inductor comprises two or more turns wherein at least one gate lies between two sections of adjacent turns of the spiral inductor, the said gate and two sections being mounted on the active mesa. Alternatively the circuit arrangement may comprise two MESFET's with the spiral inductor having an odd number of turns.

Advantageously for each gate there is a respective section of at least one turn of the spiral inductor, mounted adjacent to one another on the active mesa. The relative position of each gate with respect to at least one section may then enable the spiral inductor to have a stepped inductance.

Furthermore, the circuit arrangement may include means for grounding the spiral inductor which may comprise a transmission line electrically coupled to a ground bond pad, the ground bond pad being in electrical communication with a ground potential, or may comprise a via through hole which is in electrical communication with a ground potential.

DESCRIPTION OF DRAWINGS

By way of example, embodiments of the present invention will be described with reference to the accompanying drawings, of which FIGS. 1, 2 and 3 have already been introduced and in particular.

PREFERRED EMBODIMENTS OF THE INVENTION

Figure 1:
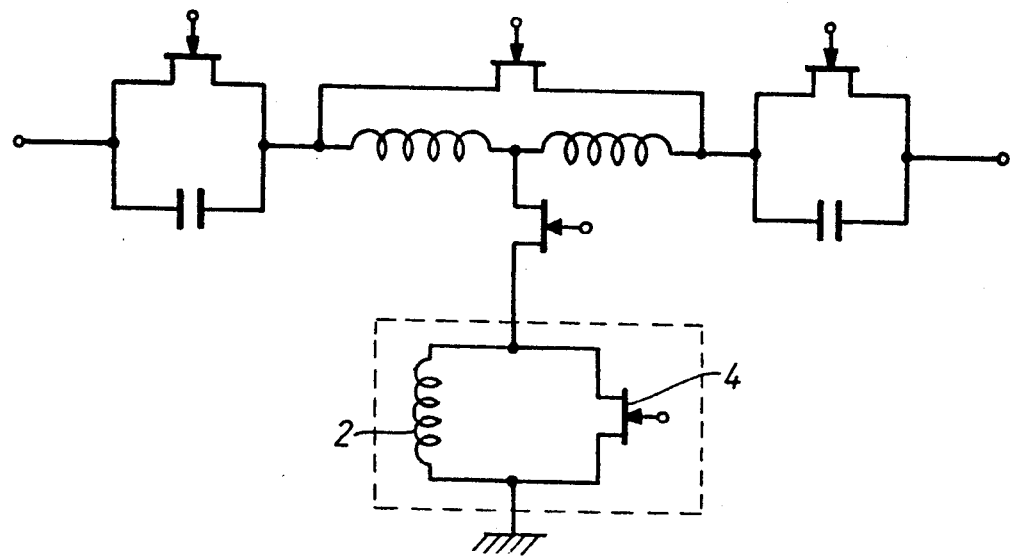
FIG. 1 illustrates a circuit diagram of a phase shifter in accordance with the prior art.

It will be appreciated that like features of the prior art and the present invention shown in the accompanying drawings share common reference numerals.

Figure 4:
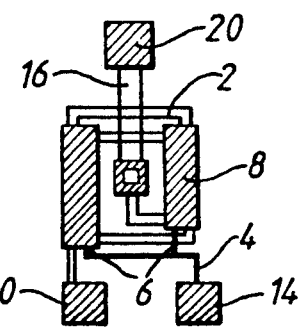
FIG. 4 is a diagram drawn to the same scale as in FIG. 2 of a switched inductor in accordance with a preferred embodiment of the present invention.
Figure 5:
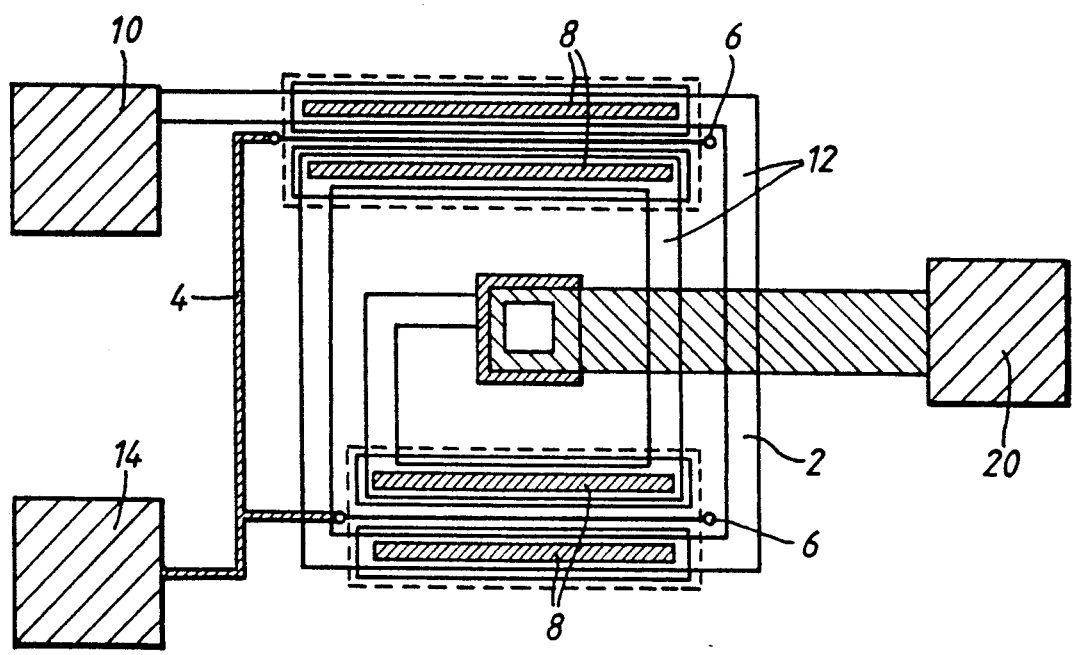
FIG. 5 is an enlarged diagram of the preferred embodiment shown in FIG. 4.

Referring to FIGS. 4 and 5, the preferred embodiment of the present invention comprises a spiral inductor 2 and a MESFET 4 coupled in parallel to form a switched inductor. The MESFET 4 has a pair of gates 6, each of which are mounted on an active Ga As mesa 8.

The Ga As active mesa 8 comprises a suitably doped mesa formed from a Ga As substrate (not shown). The techniques used for forming the active mesa 8 and for mounting the gates 6 onto the active mesa 8 are known in the art and, therefore, will not be described hereafter. The spiral inductor 2 has two turns 12, (see FIG. 5) each of which defines four sections. The spiral inductor 2 is coupled to a source 10 and is mounted partially on the substrate.

Figure 2:
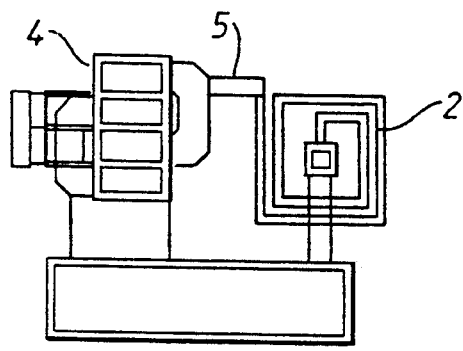
FIG. 2 is a diagram drawn to scale, of an inductor and a MESFET in accordance with the prior art.

The switching inductor has the gates 6 of the MESFET 4 positioned between adjacent sections 12 of the spiral inductor 2. However, these sections 12 having the gates 6 between them, are also mounted on the active Ga As mesa 8. This combination of the MESFET 4 and spiral inductor 2 enables parallel coupling whilst saving a considerable area of mesa, which is exemplified by comparing FIGS. 2 and 4.

The switched inductor enables the spiral inductor 2 to be switched in and out of a circuit (now shown) to which it is coupled, in the following manner.

When a negative bias is applied to the gates 6, from a d.c. control 14, the active Ga As mesa 8 is depleted of carriers, which effectively isolates the sections 12 from each other. Conduction may now only occur through the normal metallization of the turns 12 and the switched inductor enables the spiral 2 to function normally.

When a zero bias from the d.c. control 14 is applied to the gates 6, the active Ga As mesa 8 is conductive. Thus the turns 12 become short circuits directly to the centre of the spiral and the spiral inductor 2 is switched out of the circuit (not shown).

Figure 3A:
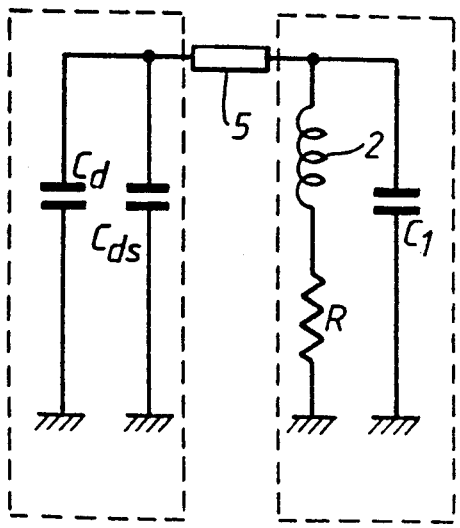
FIGS. 3a and 3b are two circuit model diagrams of the prior art inductor and MESFET shown in FIG. 2.
Figure 3B:
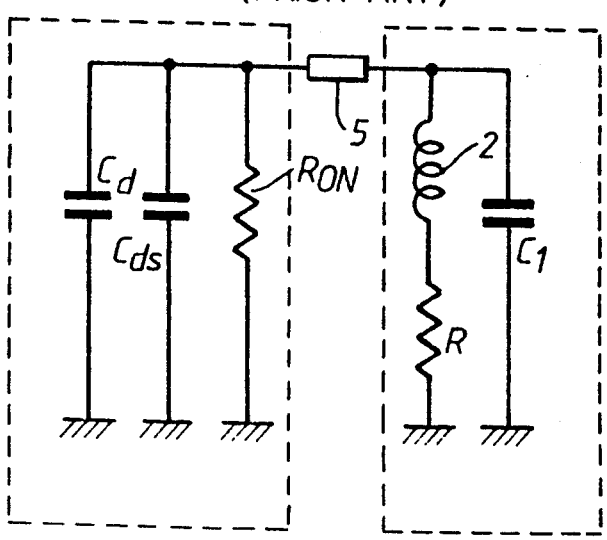
Figure 6A:
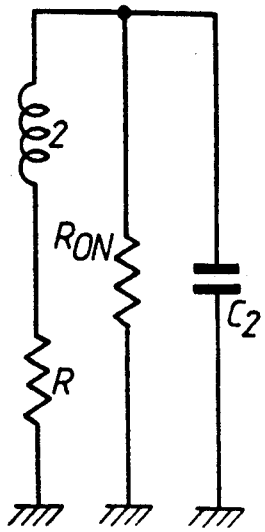
FIGS. 6a and 6b are two circuit model diagrams of the switched inductor in accordance with the preferred embodiment.
Figure 6B:
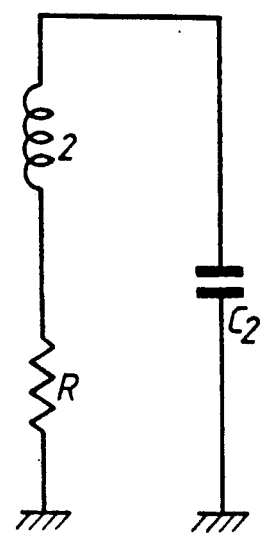

FIG. 6a illustrates the switched inductor described above having the spiral inductor switched in and FIG. 6b illustrates the switched inductor having the spiral inductor switched out of the circuit. Comparing FIG. 6 with FIG. 3, it is apparent that the parasitics due to the source-drain capacitances are obviated.

Furthermore, the switched inductor avoids the need of a transmission line 5 (shown in FIG. 2) and alleviates the uncertainties caused by the discontinuities at the junctions between the MESFET 4 and the transmission line 5, and the transmission line 5 and the spiral inductor 2.

The circuit model of the switched inductor, when the MESFET 4 is in it's "off" state, (see FIG. 6b) is almost identical to the circuit model of just the spiral inductor 2. However, the parasitic due to the spiral capacitance $C_2$ is slightly larger than the inherent spiral capacitance $C_1$ just the spiral inductor 2. This is due to the presence of the gates 6 and the active mesa 8 between the sections 12. Nevertheless the parasitic $C_2$ of the switched inductor is still smaller than all the parasitics found in the prior art circuit.

Also there will still remain the resistance R from the spiral inductor 2 and the resistance $R_{on}$ when the MESFET is in it's "on" state which also contributes to the inefficiencies in the circuit.

Figure 7:
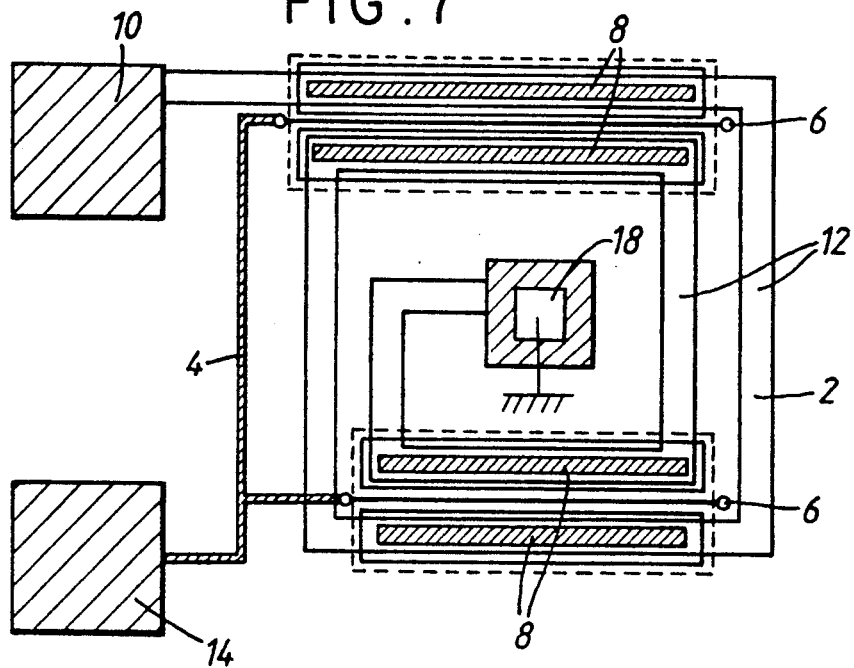
FIG. 7 is a diagram of a first embodiment of the present invention.

The spiral inductor 2 of the preferred embodiment is coupled to a ground plane (not shown) via a ground transmission line 16. The ground transmission line 16 is coupled to the ground plane by a ground bond pad 20 which is normally situated at a chip edge (not shown). However, in a first embodiment of the present invention as shown in FIG. 7 the spiral inductor 2 is coupled to the ground plane using a via through hole 18. The transmission line 16 and the ground bond pad 20 are therefore superfluous and this results in a lower spiral capacitance $C_2$. In addition, this also saves even more area of Ga As mesa, whist removing the need for the switched inductor to be situated at the chip edge.

Figure 8:
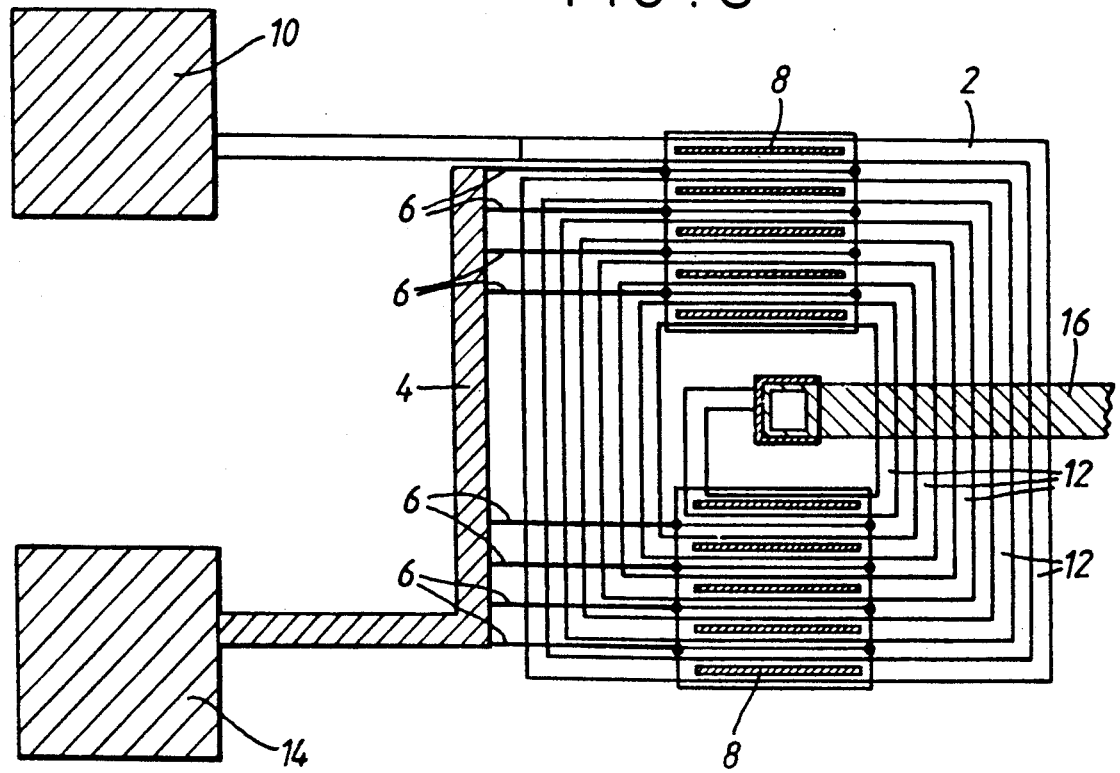
FIG. 8 is a diagram of a switched inductor in accordance with a second embodiment; and, FIG. 9 is a diagram of a switched inductor in accordance with a third embodiment of the present invention.

In a second embodiment of the present invention, which is shown in FIG. 8, there is an odd number of turns 12 of the spiral inductor 2. Consequently, to achieve a perfect short circuit when the spiral inductor 2 is switched out of the circuit, two MESFETs 4 are employed on opposite sides of the spiral inductor 2.

Figure 9:
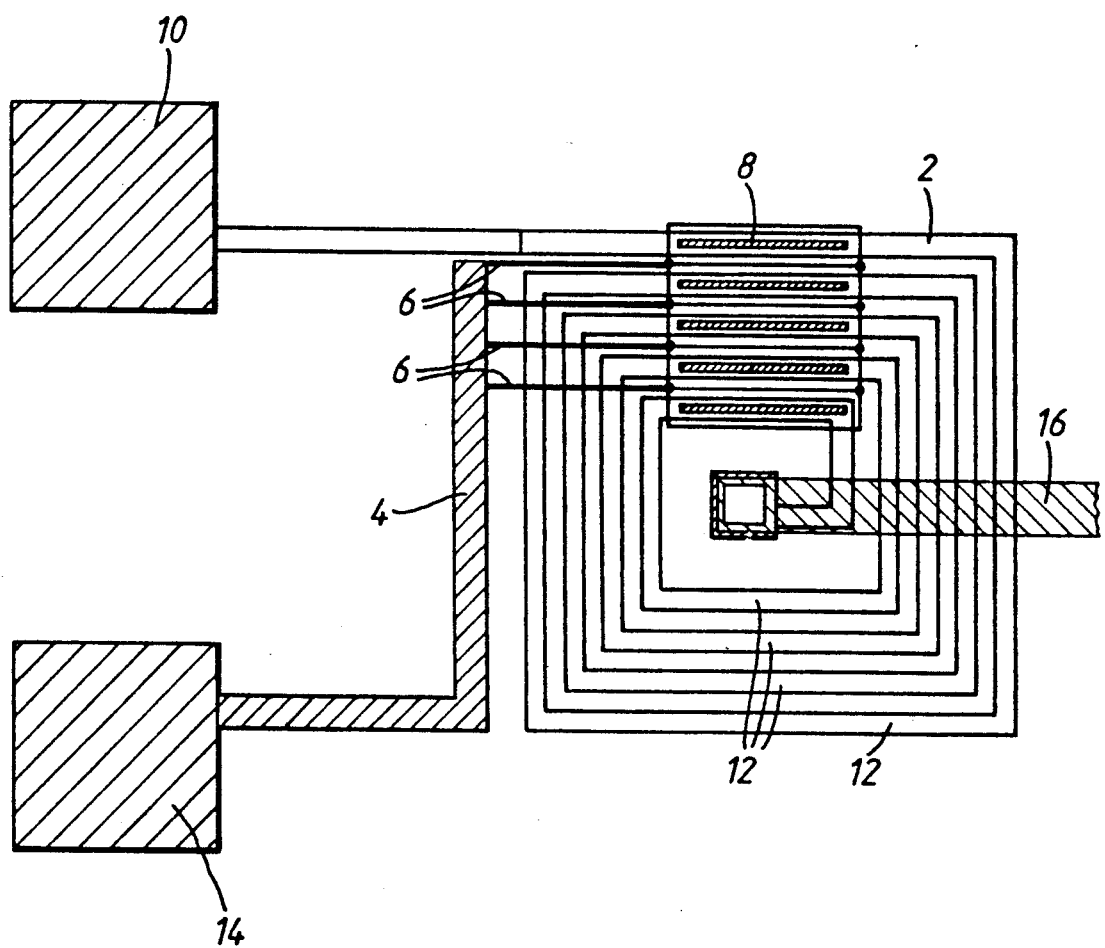

In a third embodiment shown in FIG. 9, the spiral inductor 2 has an even number of turns 12, thus an effective short circuit can be achieved with only one MESFET 4, positioned as in FIG. 9 or as in FIG. 5.

The switched inductors shown in both FIGS. 8 and 9 comprise one or two MESFETs 4 having a plurality of gates 6. Each gate 6 is positioned between adjacent turns 12 of the spiral inductor 2, thus enabling separate gates 6 to be biased in isolation from each other. This allows different numbers of turns 12 to be switched in and out of a circuit (not shown) thereby achieving a stepped variation of the inductance from the spiral inductor 2. This type of switched inductor has a specific application in circuits such as voltage controlled oscillators (VCOs) and voltage controlled filters.

For the purpose of the above described embodiments, by referring to the term switched inductor, is meant a spiral inductor coupled in parallel to a MESFET.

The foregoing embodiments have been described for example only and it will be appreciated, by a person skilled in the Art, that modifications may be made without departing from the scope of the present invention.

I claim:

1. A circuit arrangement for switching a spiral inductor in and out of a circuit, comprising:
   said spiral inductor comprising two or more turns, a spacing being provided between adjacent turns to define a section;
   at least one MESFET having an even number of gates, each gate being mounted on an active GaAs mesa surface, said spiral inductor being electrically coupled in parallel with said MESFET by having each of said gates of said MESFET positioned between adjacent sections or turns of the spiral inductor; and
   a control contact pad for receiving an electrical control bias coupled to and for controlling the MESFET, the control bias effective to switch said spiral inductor in and out of the circuit by biasing said gates of said MESFET out of and into a conductive condition, respectively;
   wherein at least one of the gates lies between two sections of adjacent turns of the spiral inductor, said two sections of adjacent turns and said at least one gate being mounted on the active GaAs mesa.

2. A circuit arrangement according to claim 1, in which the circuit arrangement further comprises means for grounding the spiral inductor, said means for grounding being coupled to the spiral inductor.

3. A circuit arrangement according to claim 1, in which for each gate there is a respective section of at least one turn of the spiral inductor mounted adjacent to one other turn on the active mesa.

4. A circuit arrangement according to claim 1, wherein said at least one MESFET comprises two MESFETs, and the spiral inductor comprises an odd number of turns.

5. A circuit arrangement according to claim 4, in which the relative position of each gate with respect to at least one section enables the spiral inductor to have an inductance value which can be varied in steps.

6. A circuit arrangement according to claim 5, in which a means for grounding the spiral inductor comprises a transmission line electrically coupled to a ground bond pad.

7. A circuit arrangement according to claim 5, in which a means for grounding the spiral inductor comprises a via through-hole which is coupled to a ground plane.

* * * * *